(12) United States Patent
Chen

(10) Patent No.: US 11,152,451 B2
(45) Date of Patent: Oct. 19, 2021

(54) DISPLAY PANEL AND DISPLAY DEVICE

(71) Applicants: HKC Corporation Limited, Shenzhen (CN); Chongqing HKC Optoelectronics Technology Co., ltd., Chongqing (CN)

(72) Inventor: Yu-Jen Chen, Chongqing (CN)

(73) Assignees: HKC CORPORATION LIMITED, Shenzhen (CN); CHONGQING HKC OPTOELECTRONICS TECHNOLOGY CO., LTD., Chongqing (CN)

( * ) Notice: Subject to any disclaimer, the term of this patent is extended or adjusted under 35 U.S.C. 154(b) by 168 days.

(21) Appl. No.: 16/341,574

(22) PCT Filed: Sep. 20, 2017

(86) PCT No.: PCT/CN2017/102457
§ 371 (c)(1),
(2) Date: Apr. 12, 2019

(87) PCT Pub. No.: WO2019/028971
PCT Pub. Date: Feb. 14, 2019

(65) Prior Publication Data
US 2020/0006460 A1      Jan. 2, 2020

(30) Foreign Application Priority Data
Aug. 8, 2017  (CN) .......................... 201710669347.9

(51) Int. Cl.
*H01L 27/32*      (2006.01)
*G02F 1/1345*    (2006.01)
*G02F 1/1362*    (2006.01)
*G09G 3/3225*    (2016.01)
*G09G 3/36*        (2006.01)

(52) U.S. Cl.
CPC ...... *H01L 27/3279* (2013.01); *G02F 1/13452* (2013.01); *G02F 1/136286* (2013.01); *G09G 3/3225* (2013.01); *G09G 3/3648* (2013.01)

(58) Field of Classification Search
CPC .............. G02F 1/13452; G02F 1/1345; G02F 1/36286; H01L 27/3276; H01L 27/3279; G09G 2300/08; G09G 3/20; G09G 3/3225; G09G 3/3648
See application file for complete search history.

(56) References Cited

U.S. PATENT DOCUMENTS

| 2010/0283955 A1* | 11/2010 | Kim ..................... G02F 1/1345 349/149 |
| 2014/0146257 A1* | 5/2014 | Fujikawa .......... G02F 1/136286 349/42 |
| 2016/0365062 A1* | 12/2016 | Wu ......................... G09G 3/20 |

* cited by examiner

Primary Examiner — Matthew C Landau
Assistant Examiner — Dmitriy Yemelyanov
(74) Attorney, Agent, or Firm — WPAT, PC

(57) ABSTRACT

A display panel and a display device are provided. The display panel includes a substrate, a plurality of signal lines, a plurality of fan-out lines, and a resistance balance member. The substrate defines a display area and a fan-out area. The signal lines are defined in the display area, and the fan-out lines are defined in the fan-out area and are electrically communicated with the signal lines. The fan-out area defines a central winding line region and a peripheral straight line region. The resistance balance member is connected to one fan-out line of the peripheral straight line region in series.

13 Claims, 4 Drawing Sheets

DISPLAY PANEL AND DISPLAY DEVICE

FIELD OF THE DISCLOSURE

The disclosure relates to a display technical field, and more particularly to a display panel and a display device.

BACKGROUND

Display generally controlled by active switches, with thin body, saving energy, no radiation and many other advantages, has been widely used, including liquid crystal display, OLED (Organic Light-Emitting Diode) display, QLED (Quantum Dot Light Emitting Diodes) displays, plasma displays, etc. It is used in flat-type display and curved type display, from the appearance of the outside structure.

For the liquid crystal display, including the LCD panel and backlight module (Backlight Module) two parts. The liquid crystal display works under the principle that, liquid crystal molecules are placed in two parallel glass substrate, and drive voltage is supplied to control the direction of rotation of the liquid crystal molecules, so as to reflect the light from the backlight module to produce a picture.

For the OLED display, light-emitting diodes are used to emit light to display, with self-luminous, wide viewing angle, almost infinite high contrast, low power consumption, high response speed and the like advantages.

QLED display has similar structure to OLED display, the main difference is that the QLED luminescence center by the quantum dots material composition. Its structure is that both electrons and holes converge in the quantum dot layer to form photons, and through the recombination of photons.

However, a display substrate has a fan-out area. One end of the fan-out area is connected to the bounding lead, and the other end is connected to the data lines or the scanning lines. The resistance of each fan-out line is not equal due to space and other reasons, and the resistance may be jump at some circumstance. As such, the resistance occurred in the location of the jump, the display panel has poor image display, the display quality is affected and the user's visual experience is reduced.

SUMMARY

The present application provides a display device and a display panel. The display device and display panel can reduce the occurrence of resistance jump.

In one embodiment, the present disclosure provides a display panel. The display panel includes a substrate, a plurality of signal lines, a plurality of fan-out lines, and a resistance balance member. The substrate includes a display area and a fan-out area. The display area includes an active switch. The signal lines are formed in the display area, and includes a plurality of scanning lines and a plurality of data lines. The scanning lines are arranged perpendicular to the data lines thereby forming a plurality of pixel regions. The signal lines are coupled to the active switch. The fan-out lines are formed in the fan-out area and are electrically communicated with the signal lines. The fan-out area defines a winding line region at the central area of the fan-out area and a straight line region defined at the peripheral fan-out area. The fan-out lines distributed in the winding line region each define a first winding line section. The resistance balance member is defined in the straight line region, and is connected with one fan-out line in series.

In one embodiment, the present disclosure provides a display device. The display device includes a controller and the above display panel.

The present application may have the following advantages. The resistance balance member is defined at the fan-out line of the fan-out area, and is configured for balancing the resistance of the fan-out lines, and avoiding the resistance of the fan-out lines unequal. In the fan-out area, the space is limited and can be used properly, and the signal delay from the welding lead to the surface can be avoided. Uniform distribution of resistance differences is achieved. Two adjacent fan-out lines have predetermined resistance difference, the resistance jump is eliminated, the image quality is improved and the user's visual experience is enhanced.

BRIEF DESCRIPTION OF THE DRAWINGS

Accompanying drawings are for providing further understanding of embodiments of the disclosure. The drawings form a part of the disclosure and are for illustrating the principle of the embodiments of the disclosure along with the literal description. Apparently, the drawings in the description below are merely some embodiments of the disclosure, a person skilled in the art can obtain other drawings according to these drawings without creative efforts. In the figures.

DETAILED DESCRIPTION OF PREFERRED EMBODIMENTS

Figure 1:
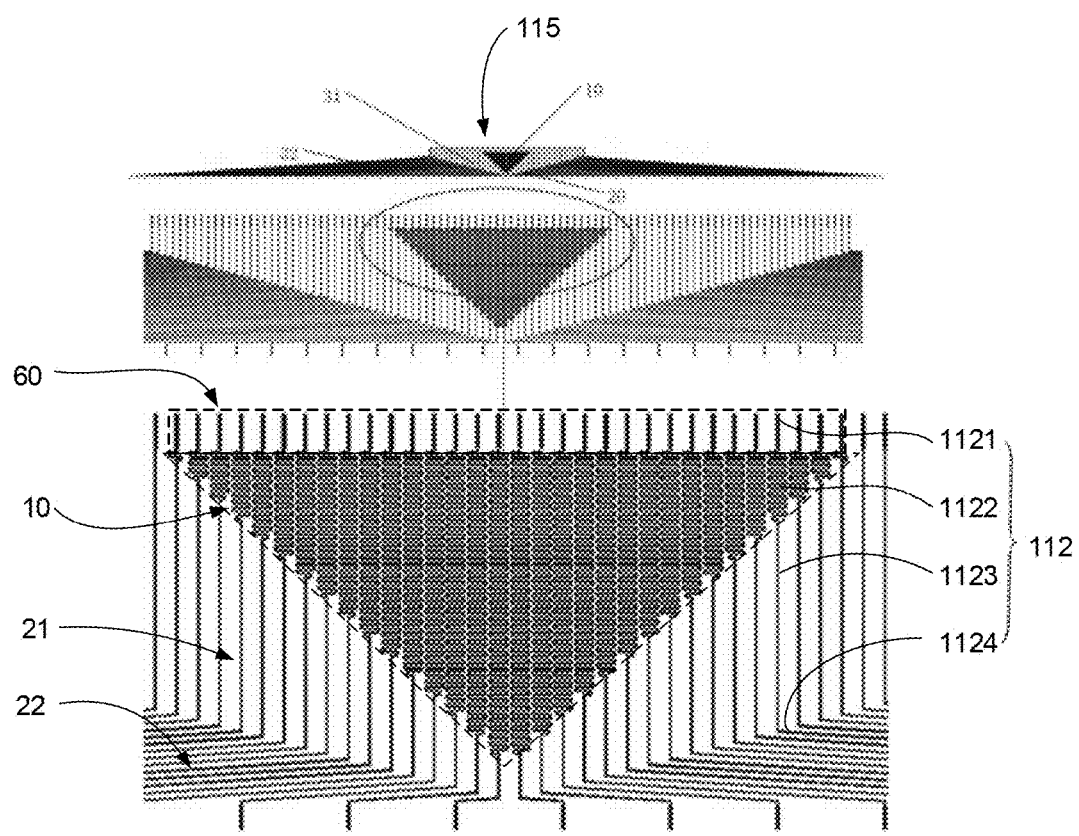
FIG. 1 is a structural schematic view of a fan-out area of a display panel, according to an embodiment of the disclosure.
Figure 2:
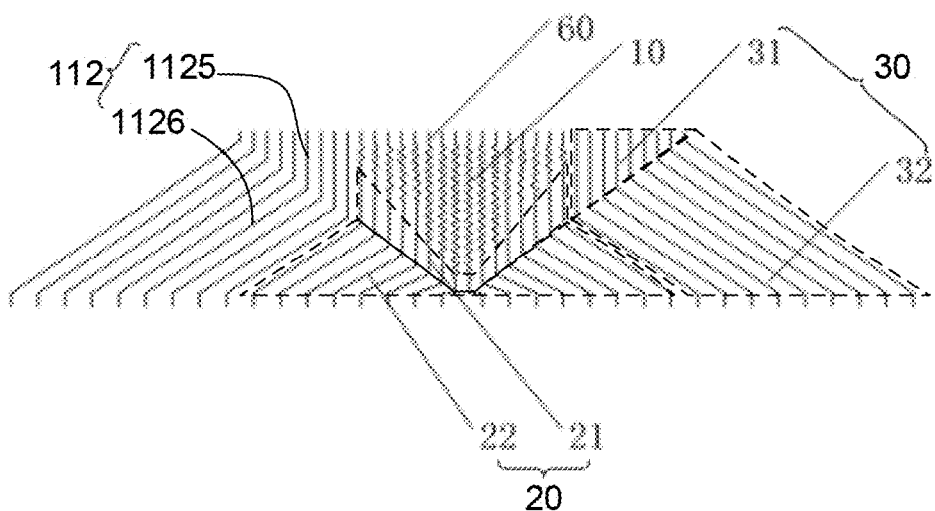
FIG. 2 is a schematic view of a number of fan-out lines defined at the fan-out area, according to an embodiment of the disclosure.
Figure 3:
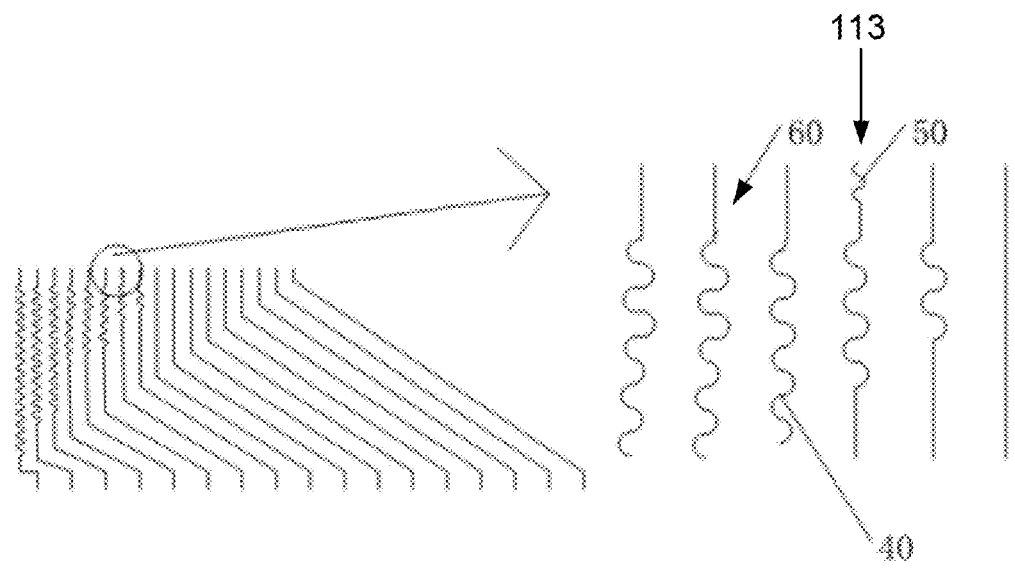
FIG. 3 is a schematic view of a second winding line section defined at a third straight line region, according to an embodiment of the disclosure.
Figure 4:
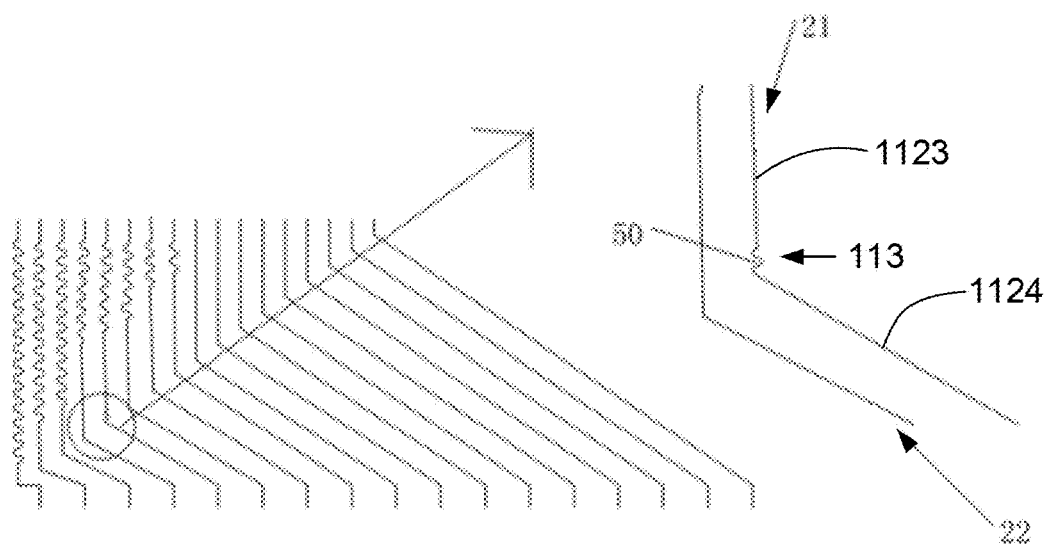
FIG. 4 is a schematic view of a second winding line section defined at a first straight line region, according to an embodiment of the disclosure.

The specific structural and functional details disclosed herein are only representative and are intended for describing exemplary embodiments of the disclosure. However, the disclosure can be embodied in many forms of substitution, and should not be interpreted as merely limited to the embodiments described herein.

In the description of the disclosure, terms such as "center", "transverse", "above", "below", "left", "right", "vertical", "horizontal", "top", "bottom", "inside", "outside", etc. for indicating orientations or positional relationships refer to orientations or positional relationships as shown in the drawings; the terms are for the purpose of illustrating the disclosure and simplifying the description rather than indicating or implying the device or element must have a certain orientation and be structured or operated by the certain orientation, and therefore cannot be regarded as limitation with respect to the disclosure. Moreover, terms such as "first" and "second" are merely for the purpose of illustration and cannot be understood as indicating or implying the relative importance or implicitly indicating the number of the technical feature. Therefore, features defined by "first" and "second" can explicitly or implicitly include one or more the features. In the description of the disclosure, unless otherwise indicated, the meaning of "plural" is two or more than two. In addition, the term "comprise" and any variations thereof are meant to cover a non-exclusive inclusion.

In the description of the disclosure, is should be noted that, unless otherwise clearly stated and limited, terms "mounted", "connected with" and "connected to" should be understood broadly, for instance, can be a fixed connection, a detachable connection or an integral connection; can be a mechanical connection, can also be an electrical connection; can be a direct connection, can also be an indirect connection by an intermediary, can be an internal communication of two elements. A person skilled in the art can understand concrete meanings of the terms in the disclosure as per specific circumstances.

The terms used herein are only for illustrating concrete embodiments rather than limiting the exemplary embodiments. Unless otherwise indicated in the content, singular forms "a" and "an" also include plural. Moreover, the terms "comprise" and/or "include" define the existence of described features, integers, steps, operations, units and/or components, but do not exclude the existence or addition of one or more other features, integers, steps, operations, units, components and/or combinations thereof.

The disclosure will be further described in detail with reference to accompanying drawings and preferred embodiments as follows.

In FIG. 1 to FIG. 8, members having similar structures are denoted by the same reference numerals.

Figure 5:
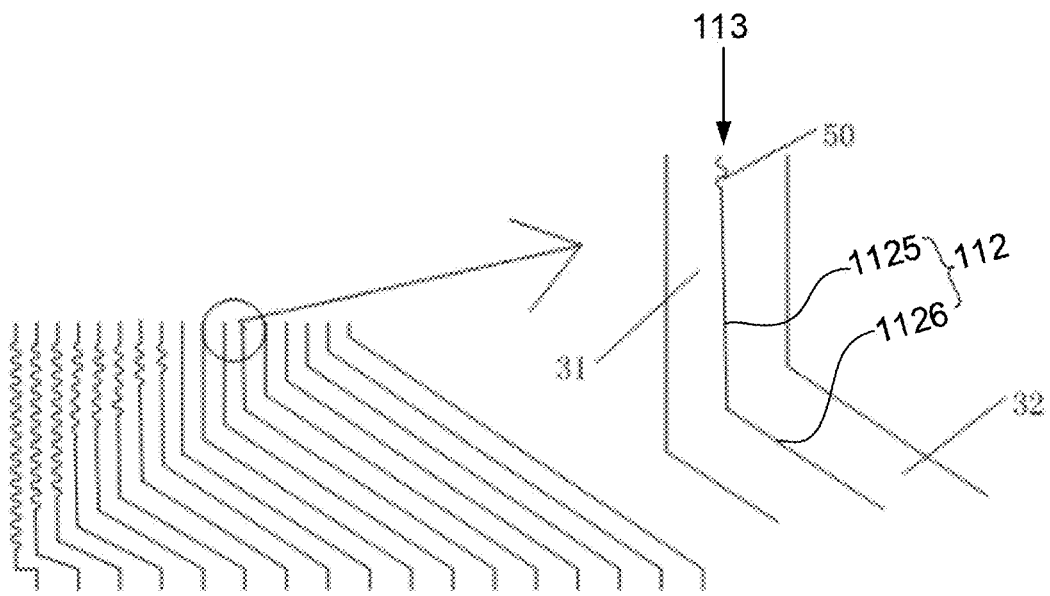
FIG. 5 is a schematic view of a second winding line section defined at a second straight line region, according to an embodiment of the disclosure.
Figure 6:
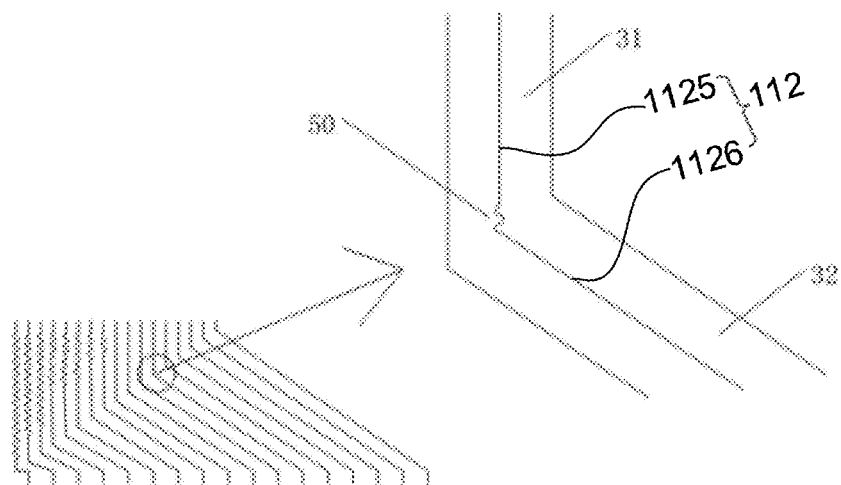
FIG. 6 is a schematic view of a second winding line section defined at a second straight line region, according to an embodiment of the disclosure.
Figure 7:
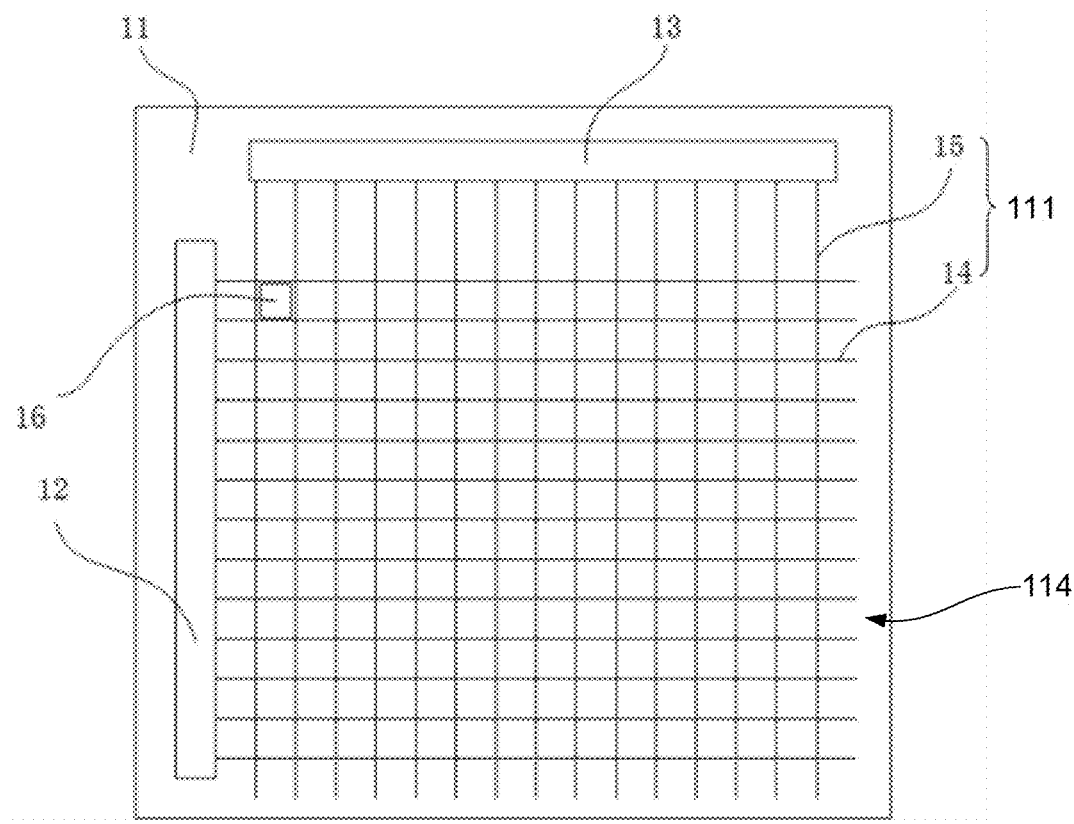
FIG. 7 is a schematic view of a display panel according to an embodiment of the disclosure.

In one embodiment of the present application, as shown in FIG. 1 to FIG. 8, a display panel is provided. The display panel includes a substrate 11, a plurality of signal lines 111, a plurality of fan-out lines 112, and a resistance balance member 113. The substrate 11 includes a display area 114 and a fan-out area 115. The display area 114 includes an active switch. The signal lines 111 are formed in the display area 114, and includes a plurality of scanning lines 14 and a plurality of data lines 15. The scanning lines 14 are arranged perpendicular to the data lines 15 thereby forming a plurality of pixel regions 16. The signal lines 111 are coupled to the active switch. As shown in FIG. 7, the display panel further includes a gate drive circuit 12 and a source drive circuit 13, which are connected to the scanning lines 14 and the data lines 15, respectively. The fan-out lines 112 are formed in the fan-out area 115 and are electrically communicated with the signal lines 111. The fan-out area 115 defines a winding line region 10 at central area of the fan-out area 115 and a straight line region defined at the peripheral fan-out area 115. The fan-out lines 112 distributed in the winding line region 10 each define a first winding line section 40. The resistance balance member 113 is defined in the straight line region, and is connected with one fan-out line 112 in series. The resistance balance member 113 is configured for balancing the resistance of the fan-out lines 112, and avoiding the resistance of the fan-out lines 112 unequal. In the fan-out area 115, the space is limited and can be used properly, and the signal delay from the welding lead to the surface can be avoided. Uniform distribution of resistance differences is achieved. Two adjacent fan-out lines 112 have predetermined resistance difference, the resistance jump is eliminated, the image quality is improved and the user's visual experience is enhanced.

In one embodiment of the present application, as shown in FIGS. 1, 2, 3 and 7, a display panel is provided. The display panel includes a substrate 11, a plurality of signal lines 111, a plurality of fan-out lines 112, and a resistance balance member 113. The substrate 11 includes a display area 114 and a fan-out area 115. The display area 114 includes an active switch. The signal lines 111 are formed in the display area 114, and includes a plurality of scanning lines 14 and a plurality of data lines 15. The scanning lines 14 are arranged perpendicular to the data lines 15 thereby forming a plurality of pixel regions 16. The signal lines 111 are coupled to the active switch. The fan-out lines 112 are formed in the fan-out area 115 and are electrically communicated with the signal lines 111. The fan-out area 115 defines a winding line region 10 at central area of the fan-out area 115 and a straight line region defined at the peripheral fan-out area 115. The fan-out lines 112 distributed in the winding line region 10 each define a first winding line section 40. The resistance balance member 113 is defined in the straight line region, and is connected with one fan-out line 112 in series. The resistance balance member 113 is defined at the fan-out line 112 of the fan-out area 115, and is configured for balancing the resistance of the fan-out lines 112, and preventing the resistance of the fan-out lines 112 from unequal.

The straight line region comprises a first straight line region 20, two second straight line regions 30, and a third straight line region 60. The first straight line region 20 is positioned below the winding line region 10. The second straight line regions 30 are located at two opposite sides of the winding line region 10, respectively. The third straight line region 60 is located on the upper side of the winding line region 10. The winding line region 10 and the straight line regions 20, 30, 60 each are distributed with a number of the fan-out lines 112. The middle fan-out lines 112 extends from the third straight line region 60 through the winding line region 10 to the first straight line region 20. In other words, the fan-out lines 112 of the winding line region 10 are connected with the fan-out lines 112 of the first straight line region 20 one by one. That is, the fan-out lines 122 at the middle of the fan-out area 115 each include a third vertical line portion 1121, a wavy line portion 1122, a first vertical line portion 1123, and a first oblique line portion 1124, connected in a sequence from top to bottom. The third vertical line portions 1121 of thus fan-out lines 112 constitute the third straight line region 60. The wavy line portions 1122 of thus fan-out lines 112 constitute the winding line portion 10, which is triangle in shape. That means, the way line portions 1122 gradually becomes smaller from the middle to the sides. The first vertical line portions 1123 and the first oblique line portions 1124 constitute the first straight line region 20. The other fan-out lines 112, i.e., the fan-out lines 112 at peripheral fan-out area 115, each include a second vertical line portion 1125 and a second oblique line portion 1126, connected from top to bottom. Thus fan-out lines 112 constitute the second straight line regions 30. In general, the length of the peripheral fan-out line 112 is larger than that of the middle fan-out line 112. In order to achieve equal impedance, the central portion of the fan-out lines 112 use a snake winding way to increase the length thereof, so as to reduce the length difference most possibly. In other words, the fan-out lines 112 of the winding line region 10 are wavy lines. This prevents the signal inconsistent occurred when it is transmitted from the solder lead to the inside.

The resistance balance member 113 is connected with one fan-out line 112 in the third straight line region 60, and is away from the winding line region 10. Such a position facilitates to design, and reduce impact on the fan-out area 115. Proper adjustment can make the resistance difference between two adjacent fan-out lines 112 being consistent.

The resistance balance member 113 includes a second winding line section 50 with a predetermined length. The second winding line section is connected with the third straight line portion 1121 of one fan-out line 112. The second winding line section 50 is easy to adjust the length thereof by bending. The resistance balance member 113 may also be a resistor, widely available and easy to use.

In detail, each of the fan-out lines 112 distributed in the winding line region 10 defines a first winding line section 40. The fan-out lines 112 distributed in the winding line region 10 are generally parallel to but spaced apart from each other, the length of the first winding line section 40 gradually becomes smaller from the middle to both sides of the winding line region 10. The first straight line region 20 includes a first vertical line section 21 below the winding line region 10 and a first oblique line section 22 connected with the first vertical line section 21. The border of the first vertical line section 21 and the first oblique line section 22 is a polyline. The second straight line regions 30 each comprise a second vertical line section 31 at one side of the winding line region 10 and a second oblique line section 32 connected with the second vertical line section 31. The border of the second vertical line section 31 and the second oblique line section 32 is an oblique line. In other words, at the left half or right half of the fan-out area 115, the junctions of the first vertical line portions 1123 and the first oblique line portions 1124 and the junctions of the second vertical line portions 1125 and the second oblique line portions 1126 are arranged along an oblique line. In the winding line region 10, the length of the middle wavy line portions 1122 is larger than that of the peripheral wavy line portions 1122.

In one embodiment of the present application, as shown in FIGS. 1, 2, 4 and 7, a display panel is provided. The display panel includes a substrate 11, a plurality of signal lines 111, a plurality of fan-out lines 112, and a resistance balance member 113. The substrate 11 includes a display area 114 and a fan-out area 115. The display area 114 includes an active switch. The signal lines 111 are formed in the display area 114, and includes a plurality of scanning lines 14 and a plurality of data lines 15. The scanning lines 14 are arranged perpendicular to the data lines 15 thereby forming a plurality of pixel regions 16. The signal lines 111 are coupled to the active switch. The fan-out lines 112 are formed in the fan-out area 115 and are electrically communicated with the signal lines 111. The fan-out area 115 defines a winding line region 10 at central area of the fan-out area 115 and a straight line region defined at the peripheral fan-out area 115. The fan-out lines 112 distributed in the winding line region 10 each define a first winding line section 40. The resistance balance member 113 is defined in the straight line region, and is connected with one fan-out line 112 in series. The resistance balance member 113 is defined at the fan-out line 112 of the fan-out area 115, and is configured for balancing the resistance of the fan-out lines 112, and preventing the resistance of the fan-out lines 112 from unequal.

The straight line region comprises a first straight line region 20, two second straight line regions 30, and a third straight line region 60. The first straight line region 20 is positioned below the winding line region 10. The second straight line regions 30 are located at two opposite sides of the winding line region 10, respectively. The third straight line region 60 is located on the upper side of the winding line region 10. The winding line region 10 and the straight line regions 20, 30, 60 each are distributed with a number of the fan-out lines 112. The middle fan-out lines 112 extends from the third straight line region 60 through the winding line region 10 to the first straight line region 20. In other words, the fan-out lines 112 of the winding line region 10 are connected with the fan-out lines 112 of the first straight line region 20 one by one. That is, the fan-out lines 122 at the middle of the fan-out area 115 each include a third vertical line portion 1121, a wavy line portion 1122, a first vertical line portion 1123, and a first oblique line portion 1124, connected in a sequence from top to bottom. The third vertical line portions 1121 of thus fan-out lines 112 constitute the third straight line region 60. The wavy line portions 1122 of thus fan-out lines 112 constitute the winding line portion 10, which is triangle in shape. That means, the way line portions 1122 gradually becomes smaller from the middle to the sides. The first vertical line portions 1123 and the first oblique line portions 1124 constitute the first straight line region 20. The other fan-out lines 112, i.e., the fan-out lines 112 at peripheral fan-out area 115, each include a second vertical line portion 1125 and a second oblique line portion 1126, connected from top to bottom. Thus fan-out lines 112 constitute the second straight line regions 30. In general, the length of the peripheral fan-out line 112 is larger than that of the middle fan-out line 112. In order to achieve equal impedance, the central portion of the fan-out lines 112 use a snake winding way to increase the length thereof, so as to reduce the length difference most possibly. In other words, the fan-out lines 112 of the winding line region 10 are wavy lines. This prevents the signal inconsistent occurred when it is transmitted from the solder lead to the inside.

The resistance balance member 113 is connected with one fan-out line 112 in the first straight line region 20. In detail, the resistance balance member 113 is defined in the first vertical line section 21 and adjacent to the first oblique line section 22. That means, the resistance balance member 113 is connected between one first vertical line portion 1123 and one corresponding first oblique line portion 1124. Such a position facilitates to adjust proper resistance balance member 113. The resistance difference between two adjacent fan-out lines 112 can be adjusted to be consistent and does not affect the fan-out area 115 occupied space.

The resistance balance member 113 includes a second winding line section 50 with a predetermined length. The second winding line section 50 is easy to adjust the length thereof by bending. The resistance balance member 113 may also be a resistor, widely available and easy to use.

In detail, each of the fan-out lines 112 distributed in the winding line region 10 defines a first winding line section 40. The fan-out lines 112 distributed in the winding line region 10 are generally parallel to but spaced apart from each other, the length of the first winding line section 40 gradually becomes smaller from the middle to both sides of the winding line region 10. The first straight line region 20 includes a first vertical line section 21 below the winding line region 10 and a first oblique line section 22 connected with the first vertical line section 21. The border of the first vertical line section 21 and the first oblique line section 22 is a polyline. The second straight line regions 30 each comprise a second vertical line section 31 at one side of the winding line region 10 and a second oblique line section 32 connected with the second vertical line section 31. The border of the second vertical line section 31 and the second oblique line section 32 is an oblique line. In other words, at the left half or right half of the fan-out area 115, the junctions of the first vertical line portions 1123 and the first oblique line portions 1124 and the junctions of the second vertical line portions 1125 and the second oblique line portions 1126 are arranged along an oblique line. In the winding line region 10, the length of the middle wavy line portions 1122 is larger than that of the peripheral wavy line portions 1122.

In one embodiment of the present application, as shown in FIG. 5, a display panel is provided similar to the above described display panel, except for the location of the resistance balance member 113. The resistance balance member 113 is defined in the second straight line region, and is connected with one fan-out line 112 therein. In detail, the resistance balance member 113 is defined in the second vertical line section 31 and is away from the second oblique line section 32. In other words, the second winding line section 50 is connected to one second vertical line portion 1125 and is away from the corresponding second oblique line portion 1126. The resistance balance member 113 includes a second winding line section 50 with a predetermined length.

In one embodiment of the present application, as shown in FIG. 6, a display panel is provided similar to the above described display panel, except for the location of the resistance balance member. The resistance balance member, which includes a second winding line section 50, is connected to one fan-out line 112 of second straight line region in series. In detail, the second winding line section 50 is connected to one fan-out line 112 of the second vertical line section 31, and is adjacent to the second oblique line section 32. In other words, the second winding line section 50 is connected between one second vertical line portion 1125 and one corresponding second oblique line portion 1126.

In the above embodiments, the display panel can be selected from a liquid crystal panel, an OLED (Organic Light-Emitting Diode) panel, a QLED (Quantum Dot Light Emitting Diodes) panel, a plasma panel, a planar panel, a curved panel, and the like.

Figure 8:
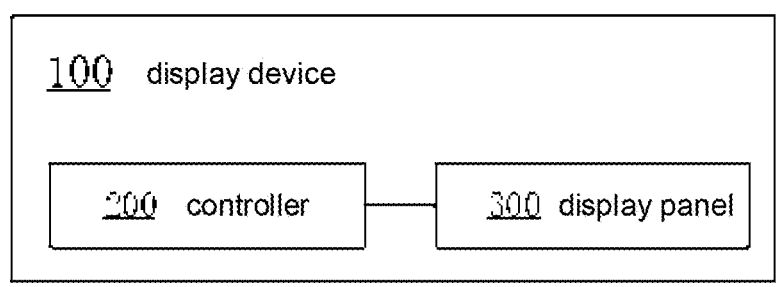
FIG. 8 is a module schematic view of a display device according to an embodiment of the disclosure.

Referring to FIG. 8, the present embodiment discloses a display device 100, The display device 100 includes a controller 200 and a display panel 300 as detailed described in the above embodiments. The description of the display panel structure of the above embodiments is also applicable to the display device of the present embodiment. When the display device of the present embodiment is a liquid crystal display device, the liquid crystal display device includes a backlight module, and the backlight module is configured for supplying a sufficient light source with uniform brightness and distribution. The backlight module can be front light type, or back light type, without limitation thereto.

The foregoing contents are detailed description of the disclosure in conjunction with specific preferred embodiments and concrete embodiments of the disclosure are not limited to these description. For the person skilled in the art of the disclosure, without departing from the concept of the disclosure, simple deductions or substitutions can be made and should be included in the protection scope of the application.

What is claimed is:

1. A display panel, comprising:
   a substrate comprising a display area and a fan-out area;
   a plurality of signal lines formed in the display area;
   a plurality of fan-out lines formed in the fan-out area, the fan-out lines being connected to the signal lines and defines a central winding line region and a peripheral straight line region; and
   a resistance balance member formed in the peripheral straight line region, wherein the resistance balance member and one fan-out line of the peripheral straight line region are connected in series;
   wherein the fan-out lines at the middle of the fan-out area each include a third vertical line portion, a wavy line portion, a first vertical line portion, and a first oblique line portion connected in sequence from top to bottom, the wavy line portions of the fan-out lines constitute the central winding line region, other fan-out lines each include a second vertical line portion and a second oblique line portion connected from top to bottom;
   wherein the first vertical line portions and the first oblique line portions of the fan-out lines at the middle of the fan-out area constitute a first straight line region in the peripheral straight line region, the first straight line region is positioned below the central winding line region and comprises a first vertical line section and a first oblique line section immediately adjacent to the first vertical line section, the first vertical line section is disposed between the central winding line region and the first oblique line section;
   wherein lengths of the first vertical line portions are gradually increased along a direction from center to edge of the first straight line region, and lengths of the first oblique line portions are gradually increased along the direction from center to edge of the first straight line region; the first oblique line portions are more close to the display area than the first vertical line portions;
   wherein the resistance balance member is connected between the first vertical line portion of the one fan-out line of the peripheral straight line region and the first oblique line portion of the one fan-out line of the peripheral straight line region.

2. The display panel according to claim 1, wherein the resistance balance member comprises a wavy electrically conductive trace.

3. The display panel according to claim 1, wherein the first vertical line section is V-shaped.

4. A display device comprising a controller and a display panel, the display panel comprising:
   a substrate comprising a display area and a fan-out area, the display area comprising an active switch;
   a plurality of signal lines formed in the display area, the signal lines comprising a plurality of scanning lines and a plurality of data lines, the scanning lines being arranged perpendicular to the data lines thereby forming a plurality of pixel regions, the signal lines being coupled to the active switch;
   a plurality of fan-out lines formed in the fan-out area, the fan-out lines being connected to the signal lines;
   a winding line region defined at the center of the fan-out area, the fan-out lines defining a first winding line section in the winding line region;
   a straight line region defined at a peripheral fan-out area; and
   a resistance balance member formed in the straight line region, the fan-out lines and the resistance balance member being connected in series;
   wherein the fan-out lines at the center of the fan-out area each comprise a wavy line portion, a first vertical line portion, and a first oblique line portion connected in sequence from top to bottom, the wavy line portions of the fan-out lines are disposed in the winding line region;
   wherein the straight line region comprises a first straight line region, and the first vertical line portions and the first oblique line portions of the fan-out lines constitute the first straight line region, the first straight line region is positioned below the winding line region and comprises a first vertical line section and a first oblique line section immediately adjacent to the first vertical line section, the first vertical line section is disposed between the winding line region and the first oblique line section;

wherein lengths of the first vertical line portions are gradually increased along a direction from center to edge of the first straight line region, and lengths of the first oblique line portions are gradually increased along the direction from center to edge of the first straight line region; the first oblique line portions are more close to the display area than the first vertical line portions;

wherein the resistance balance member is connected between the first vertical line portion of one fan-out line and the first oblique line portion of the one fan-out line.

5. The display device according to claim 4, wherein the straight line region comprises two second straight line regions, and a third straight line region, the second straight line regions are located at two opposite sides of the winding line region, the third straight line region is located on the upper side of the winding line region, each of the straight line regions is distributed with a plurality of the fan-out lines.

6. The display device according to claim 4, wherein the resistance balance member comprises a second winding line section with a predetermined length.

7. The display device according to claim 5, wherein the fan-out lines distributed in the winding line region are generally parallel to but spaced apart from each other, the length of the first winding line section gradually becomes smaller from the middle to both sides of the winding line region.

8. A display panel, comprising:
a substrate comprising a display area and a fan-out area, the display area comprising an active switch;
a plurality of signal lines formed in the display area, the signal lines comprising a plurality of scanning lines and a plurality of data lines, the scanning lines being arranged perpendicular to the data lines thereby forming a plurality of pixel regions, the signal lines being coupled to the active switch;
a plurality of fan-out lines formed in the fan-out area, the fan-out lines being connected to the signal lines;
a winding line region defined at the center of the fan-out area, the fan-out lines defining a first winding line section in the winding line region;
a straight line region defined at a peripheral fan-out area; and
a resistance balance member formed in the straight line region, one fan-out line and the resistance balance member being connected in series;

wherein the fan-out lines at the center of the fan-out area each comprise a wavy line portion, a vertical line portion, and a oblique line portion connected in sequence from top to bottom, the wavy line portions of the fan-out lines are disposed in the winding line region;

wherein the straight line region comprises a first straight line region, and the vertical line portions and the oblique line portions of the fan-out lines constitute the first straight line region, the first straight line region is positioned below the winding line region and comprises a first vertical line section and a first oblique line section immediately adjacent to the first vertical line section, the first vertical line section is disposed between the winding line region and the first oblique line section;

wherein lengths of the vertical line portions are gradually increased along a direction from center to edge of the first straight line region, and lengths of the oblique line portions are gradually increased along the direction from center to edge of the first straight line region; the oblique line portions are more close to the display area than the vertical line portions;

wherein the resistance balance member is connected between the vertical line portion of one fan-out line and the oblique line portion of the one fan-out line.

9. The display panel according to claim 8, wherein the straight line region comprises two second straight line regions, and a third straight line region, the second straight line regions are located at two opposite sides of the winding line region, the third straight line region is located on the upper side of the winding line region, each of the straight line regions is distributed with a plurality of the fan-out lines.

10. The display panel according to claim 8, wherein the resistance balance member comprises a second winding line section with a predetermined length.

11. The display panel according to claim 9, wherein the fan-out lines distribute in the winding line region are generally parallel to but spaced apart from each other, the length of the first winding line section gradually becomes smaller from the middle to both sides of the winding line region.

12. The display panel according to claim 11, wherein junctions of the vertical line portions and the oblique line portions are arranged along an oblique line, at the left half or the right half of the fan-out area.

13. The display panel according to claim 12, wherein the oblique lines at the left half and the right half are symmetrical.

* * * * *